(12) United States Patent
Jennings et al.

(10) Patent No.: US 9,590,571 B2
(45) Date of Patent: Mar. 7, 2017

(54) SINGLE STAGE BUFFER WITH FILTER

(71) Applicant: Knowles Electronics, LLC, Itasca, IL (US)

(72) Inventors: Michael Jennings, Plano, TX (US); Craig Stein, Naperville, IL (US); Dean Badillo, New Lenox, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/041,266

(22) Filed: Sep. 30, 2013

(65) Prior Publication Data

US 2014/0097906 A1    Apr. 10, 2014

Related U.S. Application Data

(60) Provisional application No. 61/708,728, filed on Oct. 2, 2012.

(51) Int. Cl.
*H04R 3/00* (2006.01)
*H03F 3/16* (2006.01)
*H03F 3/185* (2006.01)

(52) U.S. Cl.
CPC .............. *H03F 3/16* (2013.01); *H03F 3/185* (2013.01); *H04R 2410/00* (2013.01); *H04R 2410/03* (2013.01); *H04R 2410/07* (2013.01)

(58) Field of Classification Search
CPC . H04R 3/002; H04R 3/00; H04R 3/10; H04R 2410/00; H04R 2410/01; H04R 2410/03; H04R 2410/07; H03F 3/16; H03F 3/185
USPC ........ 330/306; 381/317, 318, 71.1, 94.1, 95, 381/111, 71.11
See application file for complete search history.

(56) References Cited

U.S. PATENT DOCUMENTS

| | | | |
|---|---|---|---|
| 4,592,087 A * | 5/1986 | Killion | H03F 3/2171 330/251 |
| 4,689,819 A | 8/1987 | Killion | |
| 5,083,095 A | 1/1992 | Madaffari | |
| 5,193,116 A | 3/1993 | Mostardo | |
| 5,334,883 A | 8/1994 | Rosenthal | |

(Continued)

FOREIGN PATENT DOCUMENTS

| | | |
|---|---|---|
| CN | 101944883 | 1/2011 |
| JP | 2007267410 A | 10/2007 |

OTHER PUBLICATIONS

International Search Report and Written Opinion for PCT/US2013/062867, dated Jan. 22, 2014, 30 pages.

(Continued)

*Primary Examiner* — Thomas Alunkal
(74) *Attorney, Agent, or Firm* — Faegre Baker Daniels LLP

(57) ABSTRACT

A single-stage buffer apparatus includes a first transistor, a second transistor, and a high pass filter network. The first transistor is configured to receive an input signal from a microphone. The second transistor is configured to operate as a cascode transistor. The high pass filter network is coupled to the first transistor and the second transistor. The second transistor electrically decouples the first transistor from an output of the single-stage buffer apparatus. A gate terminal of the second transistor is driven by the high-pass filter network, and the high-pass filter network is driven by the first transistor.

21 Claims, 7 Drawing Sheets

(56) References Cited

U.S. PATENT DOCUMENTS

| | | |
|---|---|---|
| 5,337,011 A | 8/1994 | French |
| 5,446,413 A | 8/1995 | Loeppert |
| 5,559,892 A | 9/1996 | Boor |
| 5,589,799 A * | 12/1996 | Madaffari ............ H03F 3/1855 330/277 |
| 5,635,880 A | 6/1997 | Brown |
| 5,654,656 A * | 8/1997 | Geannopoulos ..... H03K 17/223 327/142 |
| 5,861,779 A | 1/1999 | Loeppert |
| 6,057,737 A * | 5/2000 | Pritchard ................ H03F 1/306 330/300 |
| 6,307,944 B1 | 10/2001 | Garratt |
| 7,092,538 B2 | 8/2006 | Potter |
| 7,221,766 B2 | 5/2007 | Boor |
| 7,352,876 B2 | 4/2008 | Boor |
| 7,688,987 B2 | 3/2010 | Boor |
| 7,706,559 B2 | 4/2010 | Collins |
| 8,123,547 B2 | 2/2012 | Miller |
| 8,604,880 B2 | 12/2013 | Boor |
| 8,682,015 B2 | 3/2014 | Miller |
| 8,687,823 B2 | 4/2014 | Loeppert |
| 8,890,615 B2 | 11/2014 | Boor |
| 2002/0084855 A1 * | 7/2002 | Kwon ..................... H03F 1/223 330/311 |
| 2003/0128856 A1 | 7/2003 | Boor |
| 2003/0155980 A1 | 8/2003 | Heima |
| 2004/0179702 A1 | 9/2004 | Boor |
| 2004/0179703 A1 | 9/2004 | Boor |
| 2005/0078841 A1 | 4/2005 | Boor |
| 2005/0213787 A1 | 9/2005 | Collins |
| 2006/0049881 A1 * | 3/2006 | Rein ..................... H03B 5/1847 331/74 |
| 2007/0160234 A1 * | 7/2007 | Deruginsky .......... H02M 3/073 381/113 |
| 2007/0217628 A1 * | 9/2007 | Boor ..................... H04R 3/002 381/111 |
| 2008/0002841 A1 * | 1/2008 | Baker ..................... H03F 1/223 381/113 |
| 2009/0206936 A1 * | 8/2009 | Fernandez ........... H03K 3/0322 331/8 |
| 2010/0098284 A1 | 4/2010 | Conklin |
| 2010/0176848 A1 | 7/2010 | Du et al. |
| 2011/0006845 A1 | 1/2011 | Korner |
| 2011/0311080 A1 * | 12/2011 | Jaar ......................... H04R 3/00 381/174 |
| 2013/0058506 A1 * | 3/2013 | Boor ....................... H03F 3/185 381/122 |
| 2014/0064523 A1 * | 3/2014 | Kropfitsch ........... H03G 1/0094 381/174 |
| 2014/0112516 A1 | 4/2014 | Jiles |
| 2015/0117675 A1 | 4/2015 | Jennings |

OTHER PUBLICATIONS

European Search Report for European Patent Application No. 13844088.8, dated Jun. 9, 2016 (4 pages).

\* cited by examiner

SINGLE STAGE BUFFER WITH FILTER

CROSS REFERENCE TO RELATED APPLICATION

This patent claims benefit under 35 U.S.C. §119(e) to U.S. Provisional Application No. 61/708728 entitled "Single Stage Buffer with Filter" filed Oct. 2, 2012, the content of which is incorporated herein by reference in its entirety.

TECHNICAL FIELD

This disclosure relates acoustic assemblies and more specifically to buffer circuits within these devices.

BACKGROUND

Various types of microphone systems have been used in various applications through the years. Microphones in these systems typically receive acoustic energy and convert this acoustic energy into an electrical voltage. This voltage can be further processed by other applications or for other purposes. For example, when used in a hearing instrument (e.g., a hearing aid) the microphone may receive acoustic energy, and convert the acoustic energy to an electrical voltage. The voltage may be amplified or otherwise processed by an amplifier, or by other signal processing electronics circuitry, and then presented by a receiver as acoustic energy to a user or wearer of the hearing aid. To take another specific example, microphone systems in cellular phones typically receive sound energy, convert this energy into a voltage, and then this voltage can be further processed for use by other applications in the cellular phone. Microphones are used in other applications and in other devices as well.

In many acoustic systems, noise can be a problem. For example, in hearing instrument systems, the noise of the wind can interfere with a received voice signal and this noise can make discerning the actual voice signal difficult.

Previous attempts have utilized multi-stage buffers to reduce noise. More specifically, the electrical signal produced by the microphone is filtered. Although these buffers have been somewhat successful in reducing noise, they sometimes also suffer from various shortcomings For example, since these devices have multiple stages, they can become large in size. The large size can be disadvantageous in applications where small parts are desired such as in hearing aids or in microelectronic applications.

BRIEF DESCRIPTION OF THE DRAWINGS

For a more complete understanding of the disclosure, reference should be made to the following detailed description and accompanying drawings wherein.

Figure 1:
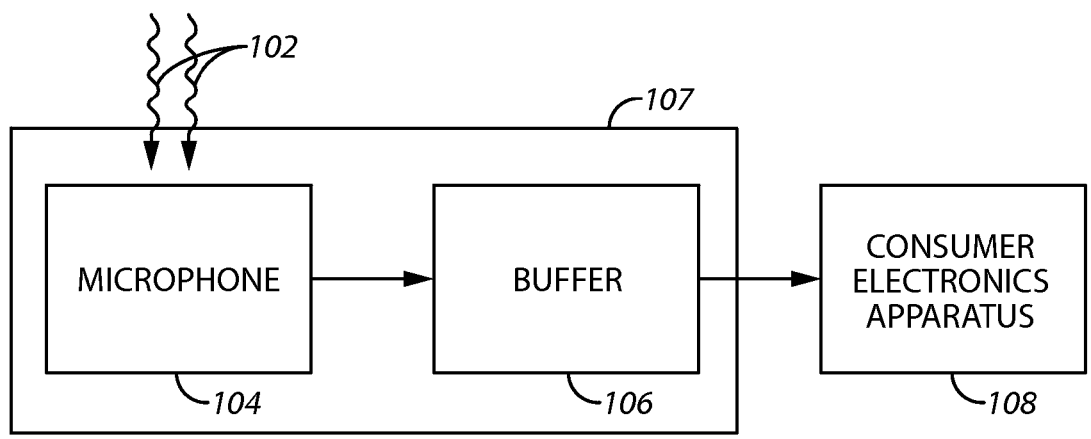
FIG. 1 is a block diagram of an acoustic system including a single-stage buffer.

Those of ordinary skill in the art will appreciate that elements in the figures are illustrated for simplicity and clarity. It will be appreciated further that certain actions and/or steps may be described or depicted in a particular order of occurrence while those of ordinary skill in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The approaches described herein provide single-stage buffer circuits in microelectromechanical system (MEMS) devices and microphones. By "MEMS" microphone or device and as used herein, it is meant an electret microphone or device, or a MEMS-based microphone or device.

Advantageously, the single-stage buffer circuits presented herein have fast output voltage settling times and incorporate high pass and/or low pass filters to provide for noise filtering capabilities. One advantage of using electronic filtering versus an acoustic implementation is that the electronic filtering is normally implemented having less noise than the acoustic implementation for the filtering function. The single-stage buffer circuits described herein are operated at much lower current levels than previous two-stage buffer circuits and still have performance characteristics that are comparable to the previous two-stage (or other multiple-stage) buffer circuits. In other aspects, the space consumed for the single-stage buffer circuits is significantly reduced as compared to previous two-stage buffer circuits.

In many of these embodiments, a single-stage buffer circuit includes a first transistor and this first transistor acts as the input transistor for receiving an input signal from a microphone (e.g., from the MEMS device of the microphone). The single-stage buffer circuit also includes a second transistor and the second transistor acts as a cascode transistor. A high pass filter is coupled to the first transistor and the second transistor. The second transistor electrically decouples the first transistor from an output of the single-stage buffer circuit. By "decouples," it is meant that the output of the first stage can only affect the output of the second transistor through the signal path comprising both of these two outputs: the high pass filter and the gate of the second transistor. In other words, there is no forward path from the output of the first transistor to the output of the second transistor through the drain of the second transistor. The high-pass filter capability is created by driving the gate of the second transistor with the high-pass filter network which itself is driven by the first transistor. In some aspects, back gates of both the first transistor and second transistor are dc biased to ground via the high pass filter resistor and modulated with an in-phase output signal via a capacitor of the high pass filter.

Referring now to FIG. 1, one example of an acoustic system that includes a single-stage buffer circuit is described. Incoming sound energy 102 is received by a microphone 104. For example, the sound energy 102 can be received from any source (e.g., human voice, music, and so forth). The microphone 104 is any microelectromechanical system (MEMS) device that includes a diaphragm and a back plate. The configuration of the microphone 104 may also be any configuration such as a top port or bottom port microphone. The sound energy 102 causes movement of the diaphragm and this varies the electrical potential between the diaphragm and the back plate. The voltage that is produced represents the sound energy 102 that has been received by the microphone 104.

The voltage produced by the microphone 104 is transmitted to a buffer circuit 106. The buffer circuit 106 removes noise from the signal received from the microphone 104. In this respect and as described in greater detail herein, the buffer circuit 106 is a single or one-stage buffer circuit that incorporates a high pass filter therein. Alternatively, the buffer circuit may include a low pass filter or a band-pass filter.

The buffer circuit 106 is coupled to a costumer electronics apparatus 108. The customer electronics apparatus 108 is any application, circuit, or other type of device that uses or processes the signal from the buffer circuit 106. For example, the customer electronics apparatus 108 may be a hearing aid application, a cellular telephone application, or a personal computer application to mention a few examples. The consumer electronics apparatus 108 may perform any processing, display, communication, or other function. The microphone 104 and buffer 106 may be disposed in a housing 107 (with suitable openings from the entry of the sound energy 102 from the external environment).

As used herein, a single or one-stage buffer is a device that performs independent work or processing in the signal path between the input of the single stage buffer and the output of a single-stage buffer. In one aspect, the independent work or processing includes filtering that is performed between the input and the output. With a two-stage device, another set of transistors performs another function (besides filtering) between the input and the output. Put another way, a one-stage device is electrically decoupled from other stages and drives the other stages all within (between the input and output) of the single stage device.

To take one example and as described in detail elsewhere herein, the high pass filter is incorporated into the one-stage microphone buffer circuit 106 and this device uses an input transistor and a cascode transistor. In one aspect, the cascode transistor decouples the source of the input transistor from the high pass filtered buffer output. This is advantageous because the signal is buffered and processed by transistors that share all of the bias current which allows maximum noise performance for a given bias current and the lowest total bias current. In another example, the high pass filter capacity is created by driving the cascode transistor's gate with the high pass filter network.

In yet other aspects, a low pass filter may be achieved by connecting a shunt chip capacitor from the buffer output to ground on the assembly. In still other aspects, a band pass filter may also be incorporated into the buffer 106.

Figure 2:
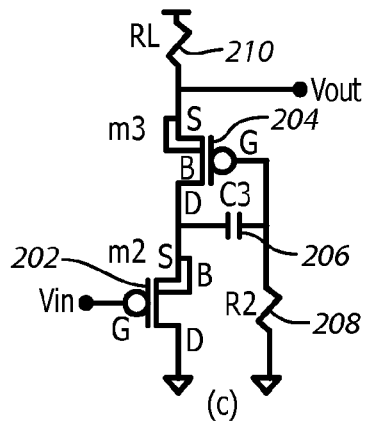
FIG. 2 is a circuit diagram a circuit diagram of a single stage, voltage follower circuit.

Referring now to FIG. 2, one example of a single stage buffer circuit 200 is described. The circuit 200 includes a first transistor 202 (M2), a second transistor 204 (M3), a capacitor 206 (C3), and a resistor 208. A purpose of the buffer 200 is to provide unity gain amplification and another purpose is to reduce noise. The transistors 202 and 204 include gate (G), source (S), drain (D), and bulk or back gate (B) terminals and are, in this example, PMOS devices. In one example, the capacitor 206 (C3) has a value of approximately 500 pF and the resistor 208 (R2) has a value of approximately 4M ohms. Other values are possible. A resistor 210 is a bias resistor and in one example is approximately 41K ohms.

In the circuit of FIG. 2, the bulk terminal (B) is tied to the source terminal (S). When a transistor is operated in this configuration, the source voltage (Vs) is equal to the gate voltage (Vg) plus the threshold voltage and the overdrive voltage (Vs=Vg+(Vth+Vod)). In other words, Vs(M2) is equal to Vg(M2), shifted by a fixed voltage (provided the bias current is fixed). This relationship holds for dc conditions and for transient conditions. Therefore, applying a voltage signal to the gate of M2, Vs(M2) will track this signal, or "follow" it. Consequently this configuration is a "source follower". The small signal voltage gain of this circuit (neglecting capacitive loading at the input of M2, output conductances of both transistors, and assuming gm2=gm3 is:

$$Av=gm*RL/(1+gm*RL),$$

Where, gm2 is the transconductance (gate-source voltage to drain-source current conversion gain) of the transistor 202 (M2), gm3 is the transconductance (gate-source voltage to drain-source current conversion gain) of the transistor 204 (M3) and RL is the load resistance connected to the source. If gmRL>>1 then the voltage gain approaches unity.

A High Pass Filter (HPF) is incorporated into this circuit and includes the capacitor 206 (C3) and the resistor 208 (R2). The drain terminal (D) of the first transistor 202 (M2) is connected to ground.

It will be appreciated that the circuit presented here is only one possible implementation of a buffer. For example, NMOS devices and a current sink could also be used. The resistor R2 biases the gate of the second transistor 204 (M3) and the capacitor C3 and resistor R2 are configured as a high pass filter with respect to Vout1 and Vg(of M3).

As mentioned, the circuit of FIG. 2 includes a high pass filter that is integrated into the buffer circuit (e.g., it is disposed at neither the input nor output of the circuit) and offers numerous advantages over positioning the device at the input or the output of the buffer. For example, large resistors (that add a large amount of noise) and/or large capacitors (that are difficult to integrate into the buffer) are not required as they would be if the high pass filter elements were coupled in series at the buffer input (e.g., at the gate of the transistor 202). In addition, adding a large capacitor at either the input or the output would be counterproductive since the filter capacitor would appear to be in series with a relatively small microphone capacitance. This would be a problem because the gain would be severely attenuated via the capacitive divider formed from the motor and high pass filter capacitor at the input.

The integrated approaches described herein also avoid adding the high pass filter to the output of the buffer and thereby eliminate problems associated with such a configuration including making the dc bias point unavailable. Making the dc bias point unavailable is undesirable because customers sometimes dc couple to the microphone output and a dc bias point is provided at ground via the high pass filter resistor in this configuration. However, since integrating capacitors limit the amount of total capacitance that can be put on a die due to the area constraints placed on the die by the microphone performance/packaging, the high pass filter resistor must be in the megohm range. This makes the output impedance of this configuration large and may affect overall gain and noise of the system. Positioning the filter at the output also makes the circuit impossible to use in two-wire mode. Finally, whether at the output or the input the present approaches also avoid the use of inductors, which can be large and expensive to utilize.

Figure 3:
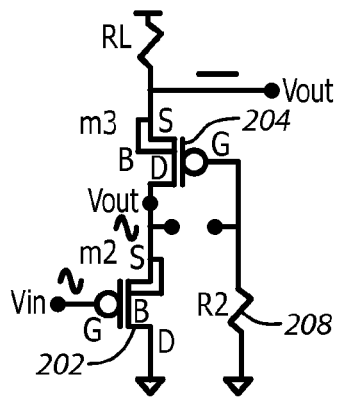
FIG. 3 is a circuit diagram of the equivalent circuit of FIG. 2 when operating at low frequencies.
Figure 10:
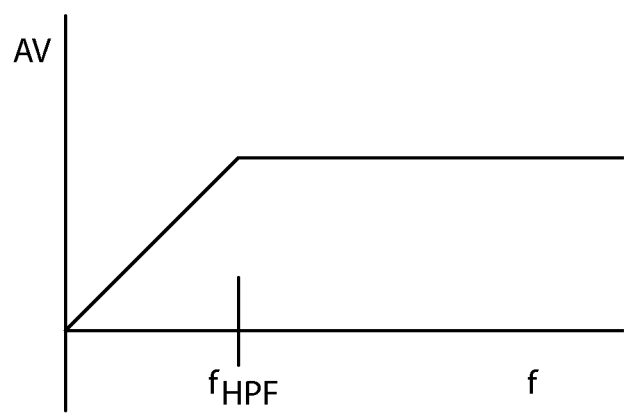
FIG. 10 is a graph showing the high pass filtering function achieved by the buffer circuits presented herein.

Referring now to FIG. 3, one example of an equivalent circuit for FIG. 2 when the circuit is operating at low frequencies is described. The behavior of the transistor 204 (M3) is frequency dependent. At frequencies far below the HPF corner frequency, $f_{HPF}$ (($f_{HPF}$=½pi*R2 *C3), where (R2) is the resistance of resistor 208 (R2) and C2 is the capacitance of the capacitor 206 (C3)), the capacitor 206 (C3) can be roughly approximated as an open circuit. This is shown in the graph of FIG. 10. In other words, the gate of the transistor 204 (M3) is connected to ground through the resistor 208 (R2). The output Vout is connected to the source of the transistor 204 (M3), and the transistor 204 (M3) functions as a source follower. Since the gate of the transistor 204 (M3) is connected to the dc potential of ground, the source voltage of the transistor 204 (M3), Vs(M3) (which is equal to Vout) will not present any signal regardless of the amplitude provided at Vg(M2).

Figure 4:
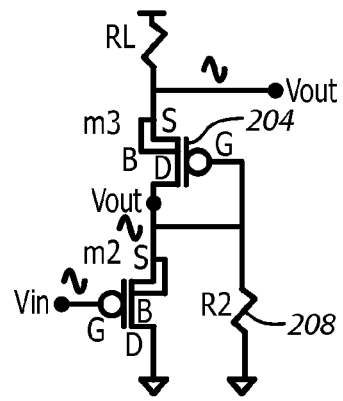
FIG. 4 is a circuit diagram of the equivalent circuit of FIG. 2 when operating at high frequencies.

Referring now to FIG. 4, an example of an equivalent circuit for the circuit of FIG. 2 when the circuit is operating at high frequencies is described. At frequencies above $f_{HPF}$, the capacitor 206 (C3) can be approximated as a short circuit. In this case, Vout1 drives the resistor 208 (R2). In other words, Vg(M3)=Vout1. The drain and gate voltages of the transistor 204 (M3) are equal. This biasing configuration of the transistor 204 (M3) is referred to as "diode connected" since there are effectively only two terminals (the source and the drain/gate) and the voltage across the two terminals is roughly fixed for a given bias current. At these frequencies, the full amplitude of Vout1 will be present at Vout.

In summary, at low frequencies the transistor 204 (M3) operates as a source follower and blocks the signal from reaching Vout. At high frequencies, the transistor 204 (M3) is diode connected and the signal is passed to Vout.

As mentioned, the gain of a transistor operated as a source follower is nearly unity depending on how much gmRL>>1. Adding the transistor 204 (M3) does not alter this requirement.

It will be appreciated that a MOSFET is a device with four terminals: gate, drain, source and bulk or back gate. A signal can be applied to any terminal of a MOSFET. In a source follower application, the signal is applied to the gate and the output is taken at the source terminal. However the same signal can also be applied to the bulk. The transconductance from the bulk voltage-source voltage to drain-source current is denoted gmb. Because a MOSFET can be driven from the bulk, this terminal is sometimes referred to as the back gate. Gmb is approximately one third of gm (for a transistor operating in the strong inversion, saturation region), so applying a signal to the backgate yields a higher gain than if the backgate is at ac ground.

Figure 5:
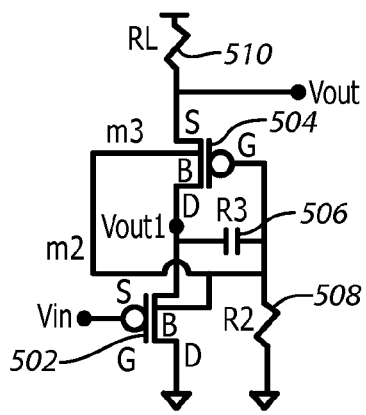
FIG. 5 is a circuit diagram of a back-gate biased, single stage, high pass filter source follower.

Referring now to FIG. 5, one example of a single stage buffer circuit 500 is described. The circuit 500 includes a first transistor 502 (M2), a second transistor 504 (M3), a capacitor 506 (C3), and a resistor 508. Some purposes of the buffer 500 are to provide unity gain amplification and noise reduction. The transistors 502 and 504 include gate (G), source (S), drain (D), and bulk or back gate (B) terminals and are, in this example, PMOS devices. In one example, the capacitor 506 (C3) has a value of approximately 500 pF and the resistor 508 (R2) has a value of approximately 4 M ohms. Other values are possible. A resistor 510 (RL) is a bias resistor and in one example is approximately 41 K ohms for 10 uA bias current at 0.9V battery.

In the example of FIG. 5, the gain of the circuit is boosted by driving the back gate with the output of the transistor 502 (M2) compared to biasing the backgate at ac ground. This biasing of the back gate in this manner offers other benefits. Because the dc bias point of the back gate (B) is lower than the source terminal, the body effect lowers the effective threshold voltage of the PMOS transistors. By "body effect," it is meant that the threshold voltage is shifted due to the difference in potential between the source and bulk node. This allows the transistors to operate over a wider voltage range, which is advantageous at low supply voltages. Finally, this approach stabilizes the dc operating point of Vout for threshold voltage variations. Assuming a fixed bias current, a lower threshold voltage would normally reduce Vout. However, lower Vout would also decrease the source-bulk voltage, reducing the body effect. Since body effect has been used to lower threshold voltage, reducing body effect will increase threshold voltage, partially compensating for the initial drop and thereby reducing the sensitivity Vout to threshold voltage process variation.

Figure 6:
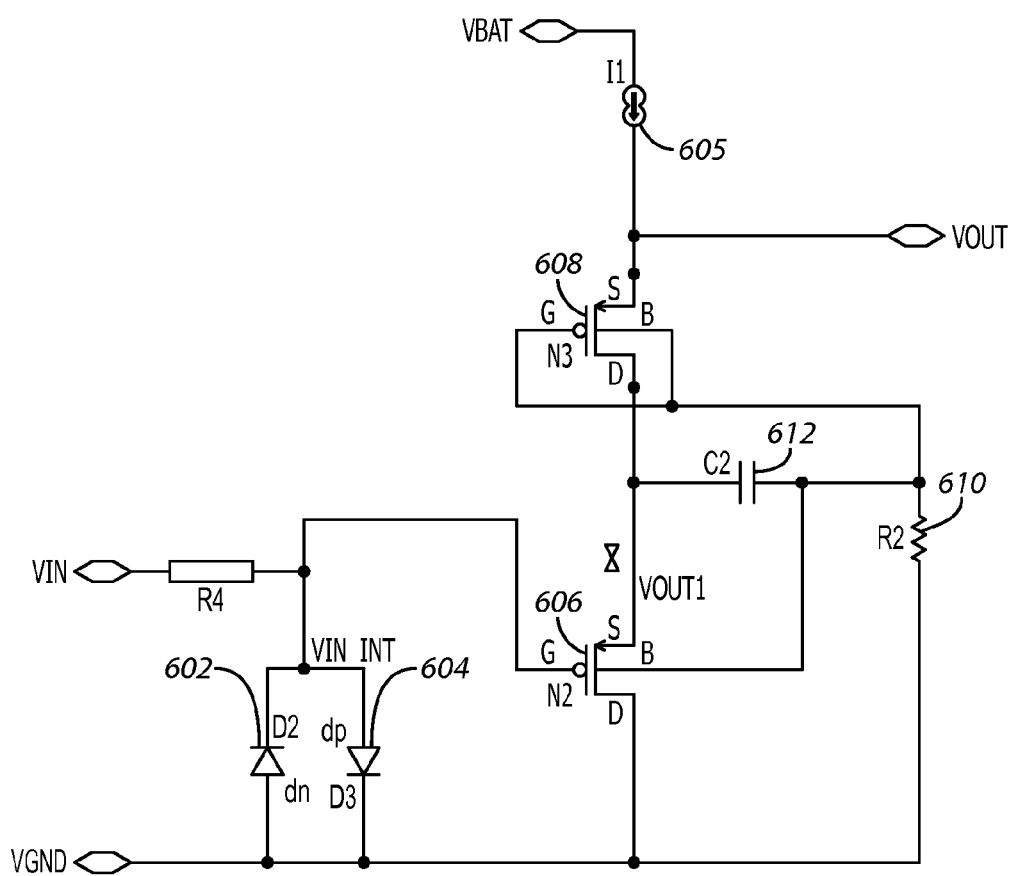
FIG. 6 is a circuit diagram of a single-stage buffer circuit with three wire arrangement.

Referring now to FIG. 6, one example of a buffer circuit 600 is described. The buffer circuit 600 includes a first diode 602, a second diode 604, a first transistor 606, a second transistor 608, a resistor 610, and a capacitor 612. The source (S), drain (D), gate (G), and bulk or back gate (B) nodes are shown in the devices illustrated in FIG. 6.

The first transistor 606 is an input transistor, and in this example is a PMOS device. The second transistor 608 is a cascode transistor, and in this example is a PMOS device.

A high pass filter is formed by the diodes 602 and 604, the resistor 610, and the capacitor 612. In one example, the resistor 610 has a value of approximately 4 M ohms and the capacitor 612 has a value of approximately 500 pF farads.

The high pass filter is incorporated into the buffer circuit using the second transistor 608 to decouple the source node of the input transistor 606 from the high pass filtered buffer output at Vout. This is advantageous because the signal can be buffered by the input transistor and filtered by the passive network driving the cascode and ultimately allowing the cascode to provide a buffered and filtered version of the input to the buffer while using all of the bias current to perform this function. The high pass filter function is created by driving the gate of the second transistor 608 with the high pass filter network, which is driven by Vout1.

Additionally, the back gate of both the input transistor 606 and the cascode device 608 are dc-biased to ground via the high pass filter resistor 610 and modulated with an in-phase output signal via the high pass filter capacitor 612. This arrangement allows for dynamic shifting of the transistors 606 and 608 to maximize transconductance (gm) (by utilizing the back gate transconductance, gmbs) and to maximize headroom across the cascode device without making the input transistors width-length (W/L) ratio excessively large (which would degrade the gain of the buffer circuit).

The circuit shown in FIG. 6 is configured in a three-wire mode. This three-wire mode refers to the number of connections (in this case three) available to the customer or that the customer makes with/to the circuit. These connections are made at three places in the circuit: at Vbat, Vout, and Vgnd. A battery provides a current source 605.

Figure 7:
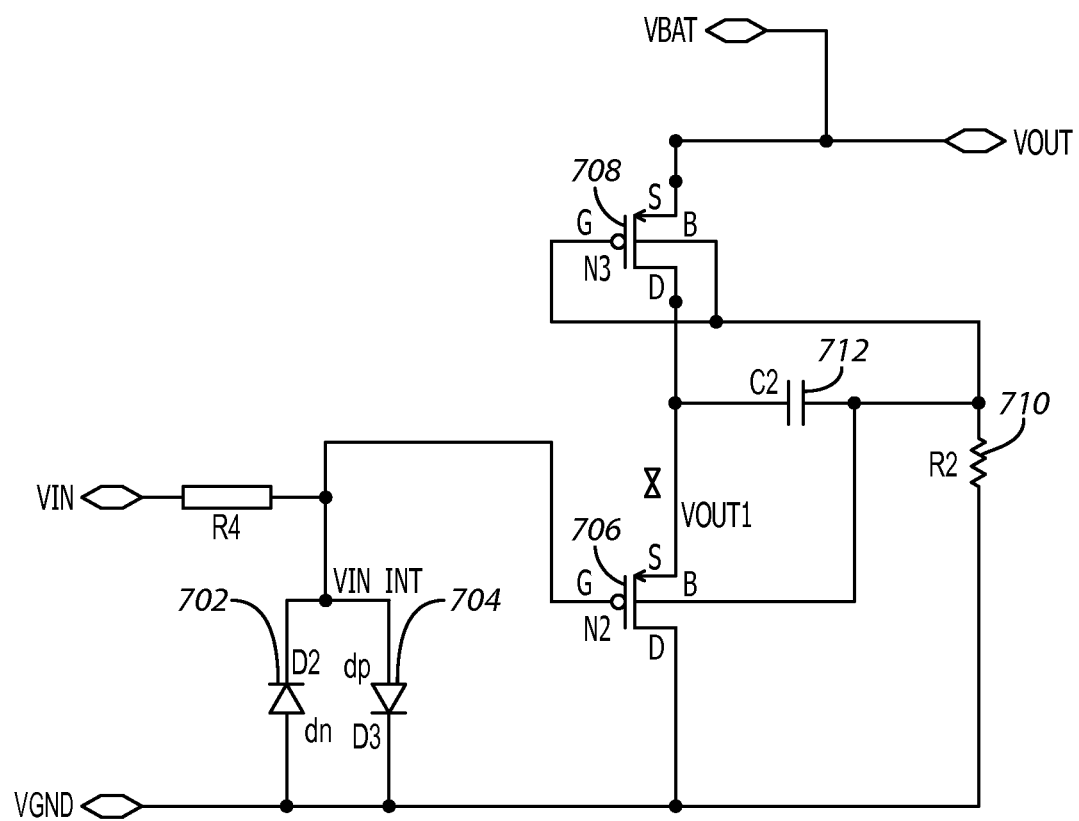
FIG. 7 is a circuit diagram of a single-stage buffer circuit with a two wire arrangement.

Referring now to FIG. 7, an example of a two-wire buffer circuit 700 is described. The buffer circuit 700 includes a first diode 702, a second diode 704, a first transistor 706, a second transistor 708, a resistor 710, and a capacitor 712.

The components are the same as those shown with respect to FIG. 6 and operate in the same manner and this description will not be repeated here. Two-wire mode is achieved by shorting Vbat and Vout (at the circuit assembly level external to the die and incorporating additional components) and having the customer provide a current source bias from which the customer can sense the output signal. It will be appreciated that previous two-stage microphone buffer circuits cannot be operated in a two-wire mode since the first stage of these circuits are not decoupled from the second stages.

Figure 8:
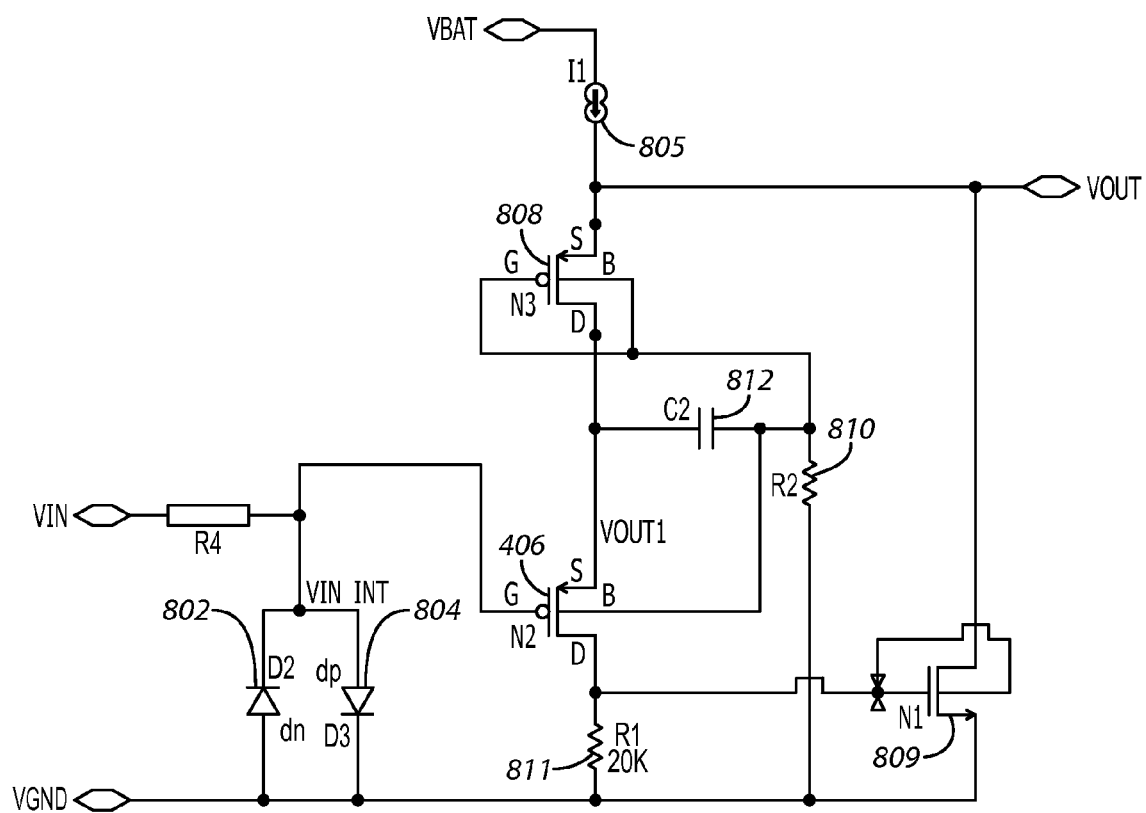
FIG. 8 is a circuit diagram of another single-stage buffer circuit.

Referring now to FIG. 8, another example of a buffer circuit 800 is described. The buffer circuit 800 includes a first diode 802, a second diode 804, a first transistor 806, a second transistor 808, a third transistor 809, a first resistor 810, a second resistor 811, and a capacitor 812. A battery provides a current source 805.

The first transistor 806 is an input transistor. In this example, the first transistor 806 is a PMOS device. The second transistor 808 is a cascode transistor. In this example, the second transistor 808 is a PMOS device.

A high pass filter is formed by the diodes 802 and 804, the resistor 810, and the capacitor 812. In one example, the resistor 810 has a value of approximately 4 M ohms and the capacitor 812 has a value of approximately 500 pF.

The high pass filter is incorporated into the buffer circuit using the second transistor 808 to decouple the source node of the input transistor 806 from the high pass filtered buffer output at Vout. This is advantageous because the signal can be buffered by the input transistor and filtered by the passive network driving the cascode and ultimately allowing the cascode to provide a buffered and filtered version of the input to the buffer while using all of the bias current to perform this function. The high pass filter function is created by driving the gate of the second transistor 808 with the high pass filter network, which is driven by Vout1.

The third transistor 809 is, in one example, an NMOS pull down transistor that operates in a "quasi" class AB mode (as is known to those of ordinary skill in the art) and can improve the output impedance of the one-stage circuit to match previous two stage buffer circuits for a lower dc bias current. In this regard, previous two-stage buffer circuits without any feedback usually have lower output impedance for a given bias current than a single stage buffer due to the decoupling that the second stage provides for the buffer output from the parasitic overlap capacitances of the input transistor 806 (back to the very high impedance of the input). The output impedance improvement that the third transistor 809 provides, allows the single stage buffer described herein to match or exceed previous two-stage circuits (one without feedback of its own) for a given current bias. The function of the second resistor 811 is to sense changes in current in the input transistor which is used to detect changes in load current (on VOUT, not shown) to the buffer which causes the vgs of transistor 809 to increase or decrease in response to increased or decreased load current into or out of transistor 406 and /or 808. This feedback causes the current in 406 and 808 to remain constant as the current in transistor 406 and 809 is increased or decreased depending on if additional current is needed to charge or discharge the load on VOUT (not shown).

Figure 9:
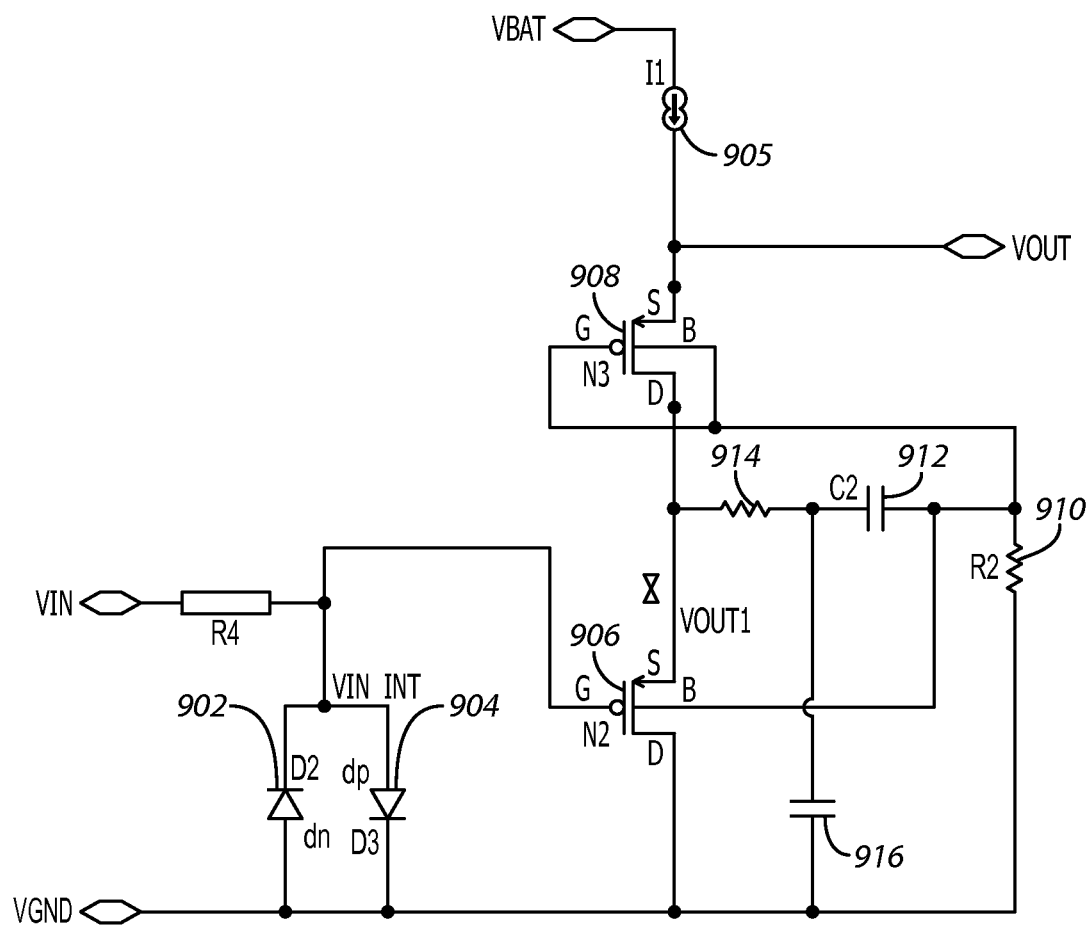
FIG. 9 is a circuit diagram of a single-stage buffer circuit with three wire arrangement.

Referring now to FIG. 9, one example of a buffer circuit 900 is described. The buffer circuit 900 includes a first diode 902, a second diode 904, a first transistor 906, a second transistor 908, a first resistor 910, a second resistor 914, a first capacitor 912, and a second capacitor 914. The source (S), drain (D), gate (G), and bulk or back gate (B) nodes are shown in the devices illustrated in FIG. 9.

The first transistor 906 is an input transistor, and in this example is a PMOS device. The second transistor 908 is a cascode transistor, and in this example is a PMOS device.

A high pass filter is formed by the diodes 902 and 904, the resistor 910, and the capacitor 912. In one example, the resistor 910 has a value of approximately 4M ohms and the capacitor 912 has a value of approximately 500 pF farads.

The high pass filter is incorporated into the buffer circuit using the second transistor 908 to decouple the source node of the input transistor 906 from the high pass filtered buffer output at Vout. This is advantageous because the signal can be buffered by the input transistor and filtered by the passive network driving the cascode and ultimately allowing the cascode to provide a buffered and filtered version of the input to the buffer while using all of the bias current to perform this function. The high pass filter function is created by driving the gate of the second transistor 908 with the high pass filter network, which is driven by Vout1.

Additionally, the back gate of both the input transistor 906 and the cascode device 908 are dc-biased to ground via the high pass filter resistor 910 and modulated with an in-phase output signal via the high pass filter capacitor 912. This arrangement allows for dynamic shifting of the transistors 906 and 908 to maximize transconductance (gm) (by utilizing the back gate transconductance, gmbs) and to maximize headroom across the cascode device without making the input transistors width-length (W/L) ratio excessively large (which would degrade the gain of the buffer circuit).

The circuit shown in FIG. 9 is configured in a three-wire mode. This three-wire mode refers to the number of connections (in this case three) available to the customer or that the customer makes with/to the circuit. These connections are made at three places in the circuit: at Vbat, Vout, and Vgnd. A battery provides a current source 905.

The buffer circuit also has a low pass filter that includes the resistor 914 (e.g., having a value of 4K ohms), the output impedance of the first stage at VOUT1, and the capacitor 916 (e.g., having a value of 500 pF). One benefit of adding the low pass filter to the output of the input transistor 906 instead of at VOUT is that the capacitor can be more easily integrated into the structure of the overall device. This capacitor value and therefore its physical area can be reduced by adding series resistance to the first stage output 906 where the total output resistance and series resistance forms the low pass filter resistor. Adding resistance to the output of 906 is also desirable since it does not increase the output impedance of the overall buffer at VOUT. Another benefit to the reduction of the low pass filter capacitor 916 and increase in series resistance is that the low pass filter capacitor 916 needs less peak charging current (slew rate) for a given output swing and will have less inter modulation distortion (which can result to audio band artifacts). This is especially important for simultaneous applied tones of high frequency, high amplitude input signals whose intermodulation products produce demodulated artifacts in the audio band due to high slew rate current required to charge and discharge the low pass filter capacitor 916.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A single-stage buffer apparatus, comprising:
   a first transistor having a first source terminal, a first drain terminal, and a first gate terminal, the first transistor configured to receive an input signal from a microphone;
   a second transistor having a second source terminal, a second drain terminal, and a second gate terminal, the second transistor configured to operate as a cascode transistor, wherein the second drain terminal of the second transistor is coupled to the first source terminal of the first transistor;

a high pass filter network including at least one capacitor and at least one resistor, wherein the at least one capacitor is coupled to the first source terminal of the first transistor and the second drain terminal of the second transistor;

wherein the second transistor electrically decouples the first transistor from an output of the single-stage buffer apparatus;

wherein the second gate terminal of the second transistor is driven by the high-pass filter network, and the high-pass filter network is driven by the first source terminal of the first transistor.

2. The apparatus of claim 1 wherein a first back gate of the first transistor and a second back gate of the second transistor are dc biased to ground.

3. The apparatus of claim 2 wherein the first back gate of the first transistor and the second back gate of the second transistor are dc biased to ground via the at least one resistor of the high pass filter network and modulated with an in-phase output signal via the at least one capacitor of the high pass filter.

4. The apparatus of claim 1 wherein the microphone is a microelectromechancial (MEMS) microphone.

5. The apparatus of claim 1 wherein a first back gate of the first transistor is biased at ac ground.

6. The apparatus of claim 1 wherein the high pass filter network uses the second transistor to decouple the first source terminal of the first transistor with the output of the buffer apparatus.

7. The apparatus of claim 1 wherein the apparatus operates in a two-wire mode.

8. The apparatus of claim 1 wherein the apparatus operates in a three-wire mode.

9. The apparatus of claim 1 further comprising a low pass filter network coupled to an output of the first transistor.

10. An audio signal buffer circuit comprising:
a first transistor having an audio signal input terminal and an output terminal;
a second transistor having a first terminal coupled to an output of the buffer circuit, the second transistor having a second terminal coupled to the output terminal of the first transistor;
a high-pass filter network coupled to the output terminal of the first transistor and to an input terminal of the second transistor, the input terminal of the second transistor is different than the first terminal and the second terminal of the second transistor;
wherein the first transistor drives the second transistor via the high-pass filter network; and
wherein the second transistor electrically decouples the first transistor from the output of the buffer circuit.

11. The audio signal buffer circuit of claim 10,
the first transistor includes a first back gate DC biased to ground; and
the second transistor includes a second back gate DC biased to ground.

12. The audio signal buffer circuit of claim 11, wherein the first back gate of the first transistor and the second back gate of the second transistor are DC biased to ground by a filter resistor of the high-pass filter network and modulated with an in-phase signal by a capacitor of the high-pass filter.

13. The audio signal buffer circuit of claim 10, the high-pass filter network includes a capacitor coupled to the output terminal of the first transistor and to the input terminal of the second transistor, the high-pass filter network including a resistor coupled to the input terminal of the second transistor and to ground.

14. The audio signal buffer circuit of claim 10 further comprising a low pass filter network coupled to the output terminal of the first transistor.

15. The audio signal buffer circuit of claim 10, wherein the audio signal buffer circuit is a three-terminal device.

16. The audio signal buffer circuit of claim 10, wherein the audio signal buffer circuit is a two-terminal device.

17. An audio signal buffer circuit comprising:
a first transistor having a first source, a first drain, and a first gate, the first gate coupled to an audio signal input, the first source coupled to an output of the first transistor;
a second transistor having a second source, a second drain, and a second gate, the second source of the second transistor coupled to an output of the buffer circuit, the second drain of the second transistor coupled to the first source of the first transistor;
a high-pass filter network coupled to the first source of the first transistor and to the second gate of the second transistor;
wherein the output of the first transistor drives the high-pass filter network and the high-pass filter network drives the second gate of the second transistor; and
wherein the second transistor decouples the output of the first transistor from the output of the buffer circuit.

18. The audio signal buffer circuit of claim 17, wherein a first back gate of the first transistor and a second back gate of the second transistor are DC biased to ground.

19. The audio signal buffer circuit of claim 18, wherein the first back gate of the first transistor and the second back gate of the second transistor are DC biased to ground by a filter resistor of the high-pass filter network and modulated with an in-phase signal by a capacitor of the high-pass filter.

20. The audio signal buffer circuit of claim 18 further comprising a low-pass filter network coupled to the output of the first transistor.

21. The audio signal buffer circuit of claim 17 further comprising a third transistor having a third source, a third drain, and a third gate, the third transistor complementary to the first transistor;
the third gate of the third transistor coupled to the first drain of the first transistor;
the third drain of the third transistor coupled to the output of the buffer circuit; and
the third source of the third transistor and the first drain of the first transistor coupled to ground.

* * * * *